US012641763B2

(12) United States Patent
Lin et al.

(10) Patent No.: US 12,641,763 B2
(45) Date of Patent: May 26, 2026

(54) SERVER SYSTEM STORAGE SYSTEM WITH SPRING OPTIMIZED STORAGE COMPONENT

(71) Applicant: Dell Products L.P., Round Rock, TX (US)

(72) Inventors: Yen-Hsing Lin, Datong District (TW); Tingchun Kuo, Neihu District (TW); Ying-Hsien Tseng, Taipei (TW)

(73) Assignee: Dell Products L.P., Round Rock, TX (US)

( * ) Notice: Subject to any disclaimer, the term of this patent is extended or adjusted under 35 U.S.C. 154(b) by 165 days.

(21) Appl. No.: 18/751,533

(22) Filed: Jun. 24, 2024

(65) Prior Publication Data

US 2025/0393180 A1      Dec. 25, 2025

(51) Int. Cl.
*H05K 9/00*          (2006.01)
*H05K 7/14*          (2006.01)
(52) U.S. Cl.
CPC ......... *H05K 9/0081* (2013.01); *H05K 7/1487* (2013.01); *H05K 9/002* (2013.01)
(58) Field of Classification Search
None
See application file for complete search history.

(56) References Cited

U.S. PATENT DOCUMENTS

| | | | | |
|---|---|---|---|---|
| 5,128,835 | A * | 7/1992 | Rudy, Jr. ................ | H05K 9/002 |
| | | | | 361/728 |
| 5,673,172 | A * | 9/1997 | Hastings .............. | H05K 7/1418 |
| | | | | 361/818 |
| 5,726,864 | A * | 3/1998 | Copeland ............. | G11B 33/126 |
| 6,661,677 | B1 * | 12/2003 | Rumney .............. | G11B 33/128 |
| 2002/0093806 | A1 * | 7/2002 | Gough ................... | G06F 1/182 |
| | | | | 361/816 |
| 2009/0059551 | A1 * | 3/2009 | He .......................... | G06F 1/187 |
| | | | | 361/818 |

OTHER PUBLICATIONS

James Utz et al., U.S. Appl. No. 18/520,615, filed Nov. 28, 2023, entitled Server System Multi Access Option Storage System.

* cited by examiner

*Primary Examiner* — Xanthia C Relford
(74) *Attorney, Agent, or Firm* — Terrile, Cannatti & Chambers, LLP; Stephen A. Terrile

(57)                ABSTRACT

A storage system. The storage system includes a storage system cartridge module, the storage system cartridge module including a top cover, the top cover including a top wall, the top wall comprising an optimized electro-magnetic shield interface facilitating insertion and removal of a storage component to a storage system housing having an associated electro-magnetic shield component.

18 Claims, 12 Drawing Sheets

8B

SERVER SYSTEM STORAGE SYSTEM WITH SPRING OPTIMIZED STORAGE COMPONENT

BACKGROUND OF THE INVENTION

Field of the Invention

The present invention relates to information handling systems. More specifically, embodiments of the invention relate to server type information handling systems within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method for providing a storage system with a storage module having a spring optimized storage component.

In one embodiment, the invention relates to a top cover for use with a storage system for an information handling system, comprising: a top wall, the top wall comprising an optimized electro-magnetic shield interface facilitating insertion and removal of a storage component to a storage system housing having an associated electro-magnetic shield component.

In another embodiment, the invention relates to a storage system comprising: a storage system cartridge module, the storage system cartridge module comprising a top cover, the top cover comprising; a top wall, the top wall comprising an optimized electro-magnetic shield interface facilitating insertion and removal of a storage component to a storage system housing having an associated electro-magnetic shield component.

In another embodiment, the invention relates to a system comprising: a chassis; a processor contained within the chassis; a data bus coupled to the processor; and, a storage system comprising a storage system comprising: a storage system cartridge module, the storage system cartridge module comprising a top cover, the top cover comprising; a top wall, the top wall comprising an optimized electro-magnetic shield interface facilitating insertion and removal of a storage component to a storage system housing having an associated electro-magnetic shield component.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
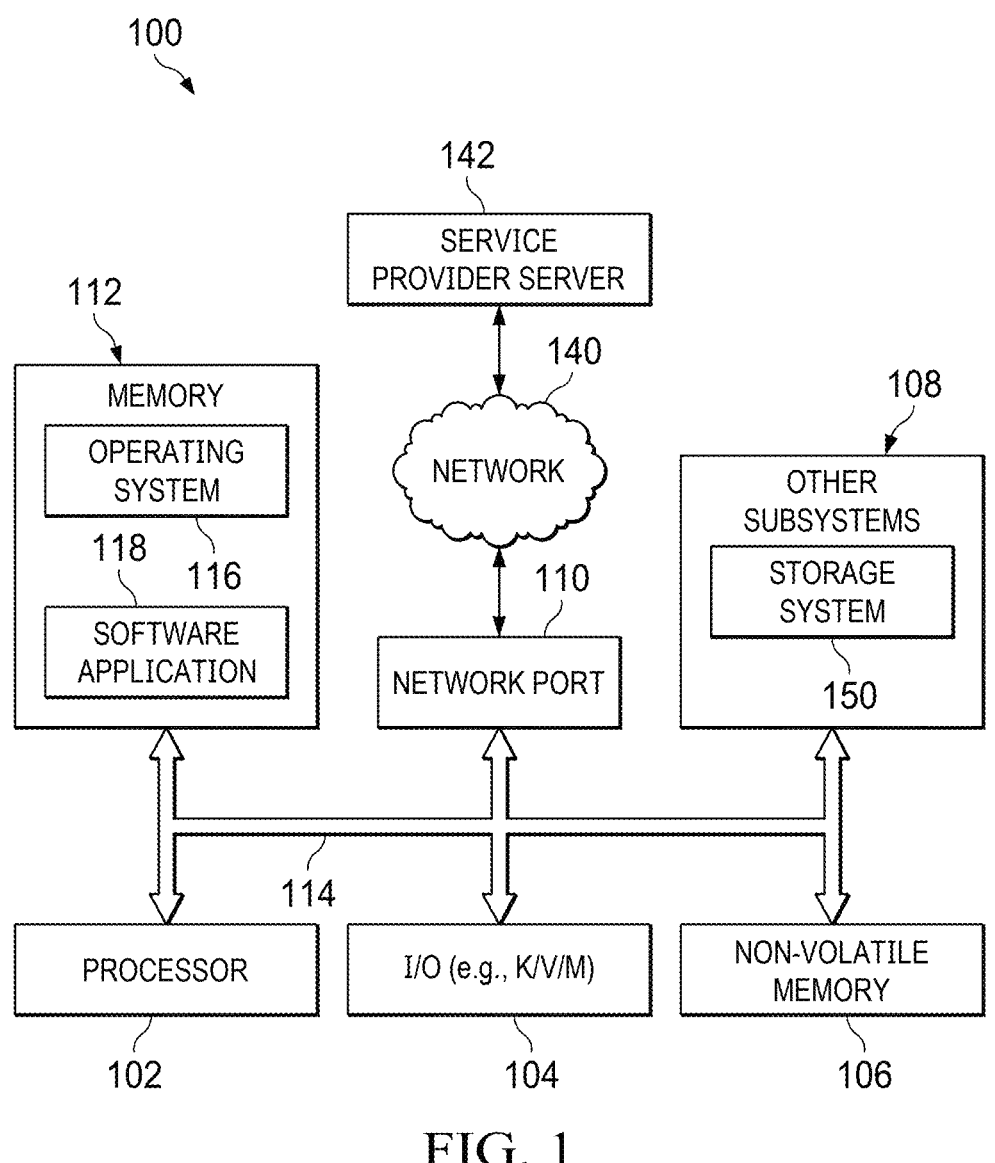
FIG. 1 shows a general illustration of components of an information handling system as implemented in the system and method of the present invention.

Various aspects of the disclosure include an appreciation that it is known to provide information handling systems with storage systems such as boot optimized storage systems. Various aspects of the disclosure include an appreciation that it is known to storage systems, such as boot optimized storage systems, which are hot swappable. Various aspects of the present disclosure include an appreciation that it is known to provide storage systems which can mount a plurality of storage components.

Various aspects of the present disclosure include an appreciation that the storage system often includes an electro-magnetic shield component which can interfere with the storage component when inserting and removing the storage component to the storage system housing. Various aspects of the present disclosure include the electro-magnetic shield component often interferes with the storage component when the storage system is mounted within an information handling system. Various aspects of the present disclosure include an appreciation that the electro-magnetic shield component includes a spring that when pressed due to being installed within an information handling system often interferes with an edge of the storage component when inserting and removing the storage component to the storage system housing.

Accordingly, various aspects of the disclosure include an appreciation that it would be desirable to provide the storage component with an optimized electro-magnetic shield interface to facilitate inserting and removing the storage component to the storage system housing.

A system and method are disclosed for providing a storage system with a storage system component which includes an optimized electro-magnetic shield interface to facilitate inserting and removing the storage component to the storage system housing.

In certain embodiments, the optimized electro-magnetic shield interface is positioned on a top component of the storage system component. In certain embodiments, the optimized electron magnetic shield interface includes an insertion chamfer portion, a removal chamfer portion, or a combination thereof. In certain embodiments, the insertion chamfer portion has a corresponding insertion chamfer angle. In certain embodiments, the removal chamfer portion has a corresponding removal chamfer angle. In certain embodiments, the corresponding insertion chamfer angle is based upon a trailing electro-magnetic shield spring angle. In certain embodiments, the corresponding removal chamfer angle is based upon a leading electro-magnetic shield spring angle.

In certain embodiments, the insertion chamfer portion, the removal chamfer portion, or a combination thereof provide a spring auto lock design. As used herein, a spring auto lock design broadly refers to a mutually dependent interaction of an electro-magnetic shield component and an optimized electro-magnetic shield interface to facilitate inserting and removing a storage component to a storage system housing having an associated electro-magnetic shield component.

In certain embodiments, the insertion chamfer angle, the removal chamfer angle, or a combination thereof provide a spring auto lock design which reduces a drop off issue associated with inserting or removing the storage component. As used herein, a drop off broadly refers to an uneven edge between a storage component and an electro-magnetic shield component of a storage system housing where the uneven edge can affect the insertion or removal of the storage component to the storage system housing.

In certain embodiments, the storage system comprises a boot optimized storage system. In certain embodiments, the boot optimized storage system comprises a redundant array of independent disks (RAID) solution optimized for booting an operating system of a server. In certain embodiments, the boot optimized storage system comprises a plurality of serial advanced technology advancement (SATA) solid state devices (SSDs), a host interface (such as a PCIe host interface), a device interface (such as a SATA device interface), or a combination thereof.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. In various embodiments, one or both the other subsystems 108 or the network port 110 include storage system 150. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack. In certain embodiments, the other subsystem 108 includes one or more power supplies for supplying power to the other components of the information handling system 100.

In certain embodiments, the information handling system 100 comprises a server type information handling system. In certain embodiments, the server type information handling system comprises a blade server type information handling system. As used herein, a blade server type information handling system broadly refers to an information handling system which is physically configured to be mounted within a server rack.

In certain embodiments, the storage system 150 comprises a storage system component which includes an optimized electro-magnetic shield interface to facilitate inserting and removing the storage component to the storage system housing. In certain embodiments, the optimized electro-magnetic shield interface is positioned on a top component of the storage system component. In certain embodiments, the optimized electron magnetic shield interface includes an insertion chamfer portion, a removal chamfer portion, or a combination thereof. In certain embodiments, the insertion chamfer portion has a corresponding insertion chamfer angle. In certain embodiments, the removal chamfer portion has a corresponding removal chamfer angle. In certain embodiments, the corresponding insertion chamfer angle is based upon a trailing electro-magnetic shield spring angle. In certain embodiments, the corresponding removal chamfer angle is based upon a leading electro-magnetic shield spring angle.

In certain embodiments, the insertion chamfer portion, the removal chamfer portion, or a combination thereof provide a spring auto lock design. As used herein, a spring auto lock design broadly refers to a mutually dependent interaction of an electro-magnetic shield component and an optimized electro-magnetic shield interface to facilitate inserting and removing a storage component to a storage system housing having an associated electro-magnetic shield component.

In certain embodiments, the insertion chamfer angle, the removal chamfer angle, or a combination thereof provide a spring auto lock design which reduces a drop off issue associated with inserting or removing the storage component. As used herein, a drop off broadly refers to an uneven edge between a storage component and an electro-magnetic shield component of a storage system housing where the uneven edge can affect the insertion or removal of the storage component to the storage system housing.

In certain embodiments, the storage system comprises a boot optimized storage system. In certain embodiments, the boot optimized storage system comprises a redundant array of independent disks (RAID) solution optimized for booting an operating system of a server. In certain embodiments, the boot optimized storage system comprises a plurality of serial advanced technology advancement (SATA) solid state devices (SSDs), a host interface (such as a PCIe host interface), a device interface (such as a SATA device interface), or a combination thereof.

Figure 2:
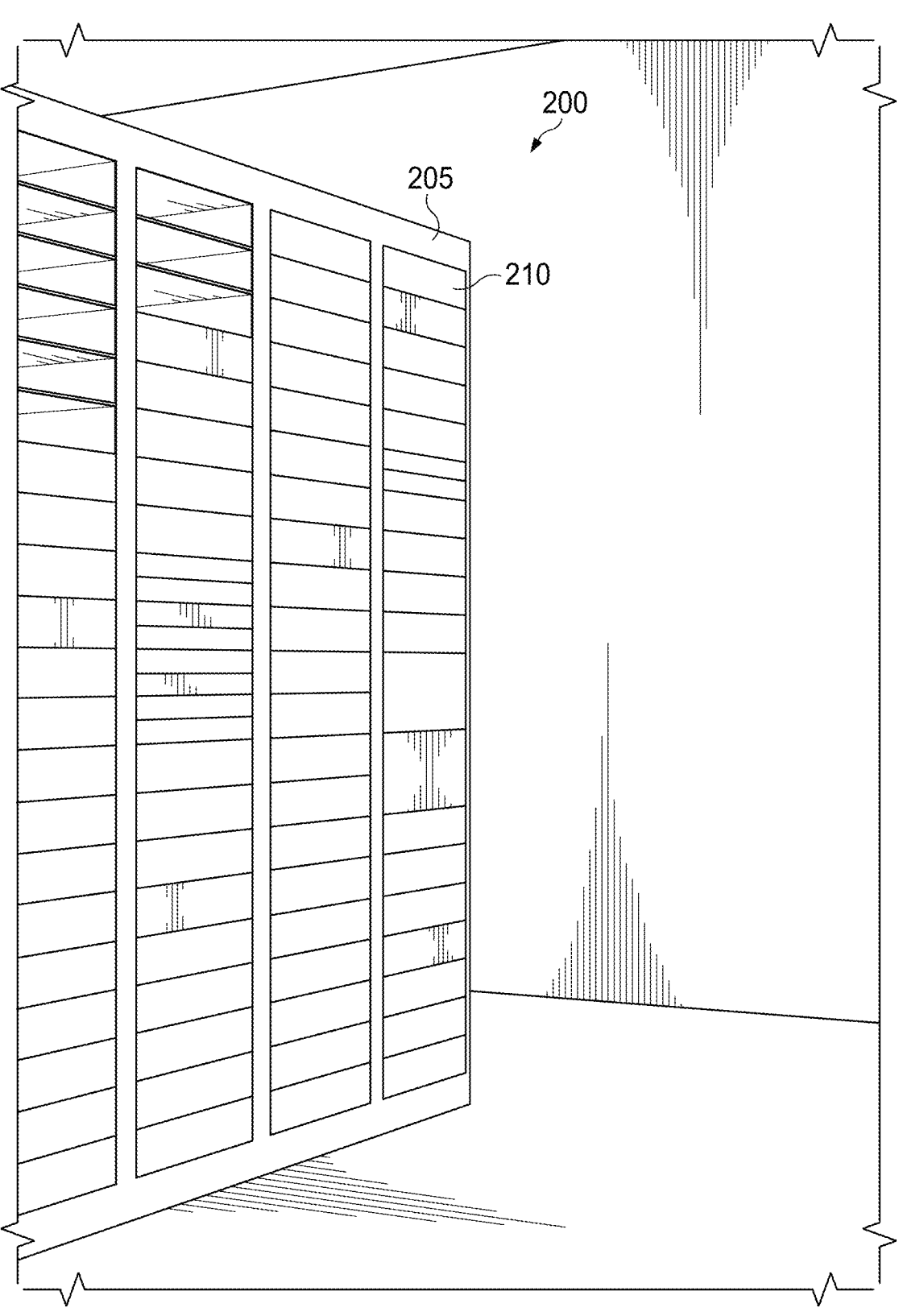
FIG. 2 shows a perspective view of a portion of a data center within an IT environment.

FIG. 2 shows a perspective view of a portion of an IT environment 200. The IT environment includes one or more racks 205 which include a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type informa- tion handling systems, server type information handling systems and application delivery controller type information handling systems. In certain environments, the information handling systems 100 are mounted within respective racks. As used herein, a rack refers to a physical structure that is designed to house the information handling systems 100 as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

In certain embodiments, a plurality of racks is arranged continuous with each other to provide a rack system. An IT environment can include a plurality of rack systems arranged in rows with aisles via which IT service personnel can access information handling systems mounted in the racks. In certain embodiments, the aisles can include front aisles via which the front of the information handling systems may be accessed and hot aisles via which the infrastructure (e.g., data and power cabling) of the IT environment can be accessed.

Each respective rack includes a plurality of vertically arranged information handling systems 210. In certain embodiments, the information handling systems may con- form to one of a plurality of standard server sizes. In certain embodiments, the plurality of server sizes conforms to particular rack unit sizes (i.e., rack units). As used herein, a rack unit broadly refers to a standardized server system height. As is known in the art, a server system height often conforms to one of a 1 U rack unit, a 2 U rack unit and a 4 U rack unit. In general, a 1 U rack unit is substantially (i.e., +/−20%) 1.75" high, a 2 U rack unit is substantially (i.e., +/−20%) 3.5" high and a 4 U rack height is substantially (i.e., +/−20%) 7.0" high.

Figure 3:
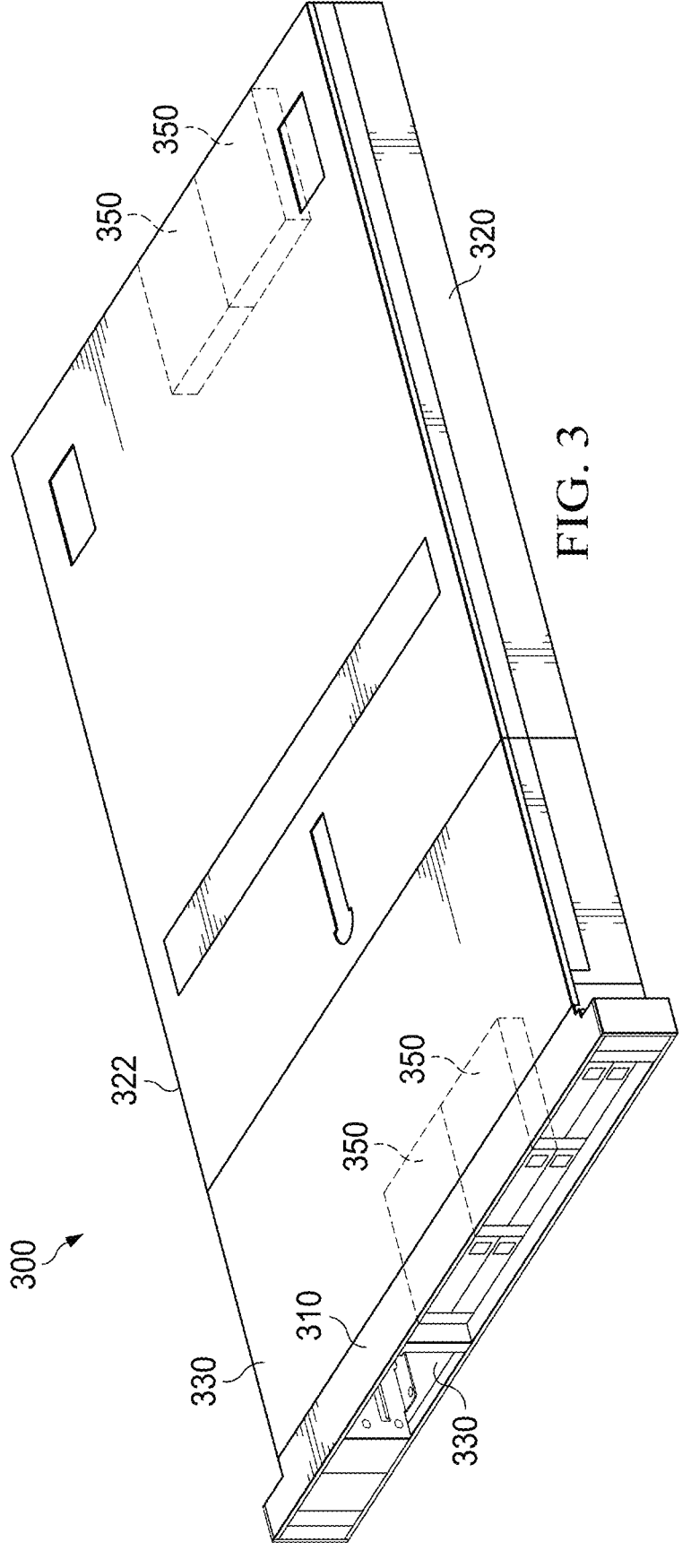
FIG. 3 shows a generalized perspective view of an example server type information handling system.

FIG. 3 shows a generalized perspective view of an example blade server type information handling system 300. In certain embodiments, the server type information han- dling system includes a front portion 310, which is acces- sible when the server type information handing system 300 is mounted on a server rack. In certain embodiments, the side portions 320, 322 mount to the rack via respective server mounting components. In certain embodiments, the side portions mount to the rack via respective mechanical guiding features which are mechanically coupled to respec- tive server mounting components. In certain embodiments, the server type information handling system can slide out from the rack via the respective mechanical guiding features. In certain embodiments, internal components of the blade type information handling system 300 may be accessed by removing a top panel 330 of the blade type information handing system 300. In certain embodiments, the blade type information handing system 300 includes a bay 350 via which components may be mounted to the blade type information handling system.

In certain embodiments, components mounted in one or more of the bays 310 include a storage system 350 which includes a storage system component which includes an optimized electro-magnetic shield interface to facilitate inserting and removing the storage component to the storage system housing.

In certain embodiments, the optimized electro-magnetic shield interface is positioned on a top component of the storage system component. In certain embodiments, the optimized electron magnetic shield interface includes an insertion chamfer portion, a removal chamfer portion, or a combination thereof. In certain embodiments, the insertion chamfer portion has a corresponding insertion chamfer angle. In certain embodiments, the removal chamfer portion has a corresponding removal chamfer angle. In certain embodiments, the corresponding insertion chamfer angle is based upon a trailing electro-magnetic shield spring angle. In certain embodiments, the corresponding removal chamfer angle is based upon a leading electro-magnetic shield spring angle.

In certain embodiments, the insertion chamfer portion, the removal chamfer portion, or a combination thereof provide a spring auto lock design. As used herein, a spring auto lock design broadly refers to a mutually dependent interaction of an electro-magnetic shield component and an optimized electro-magnetic shield interface to facilitate inserting and removing a storage component to a storage system housing having an associated electro-magnetic shield component.

In certain embodiments, the insertion chamfer angle, the removal chamfer angle, or a combination thereof provide a spring auto lock design which reduces a drop off issue associated with inserting or removing the storage compo- nent. As used herein, a drop off broadly refers to an uneven edge between a storage component and an electro-magnetic shield component of a storage system housing where the uneven edge can affect the insertion or removal of the storage component to the storage system housing.

In certain embodiments, the storage system comprises a boot optimized storage system. In certain embodiments, the boot optimized storage system comprises a redundant array of independent disks (RAID) solution optimized for booting an operating system of a server. In certain embodiments, the boot optimized storage system comprises a plurality of serial advanced technology advancement (SATA) solid state devices (SSDs), a host interface (such as a PCIe host interface), a device interface (such as a SATA device inter- face), or a combination thereof.

Figure 4:
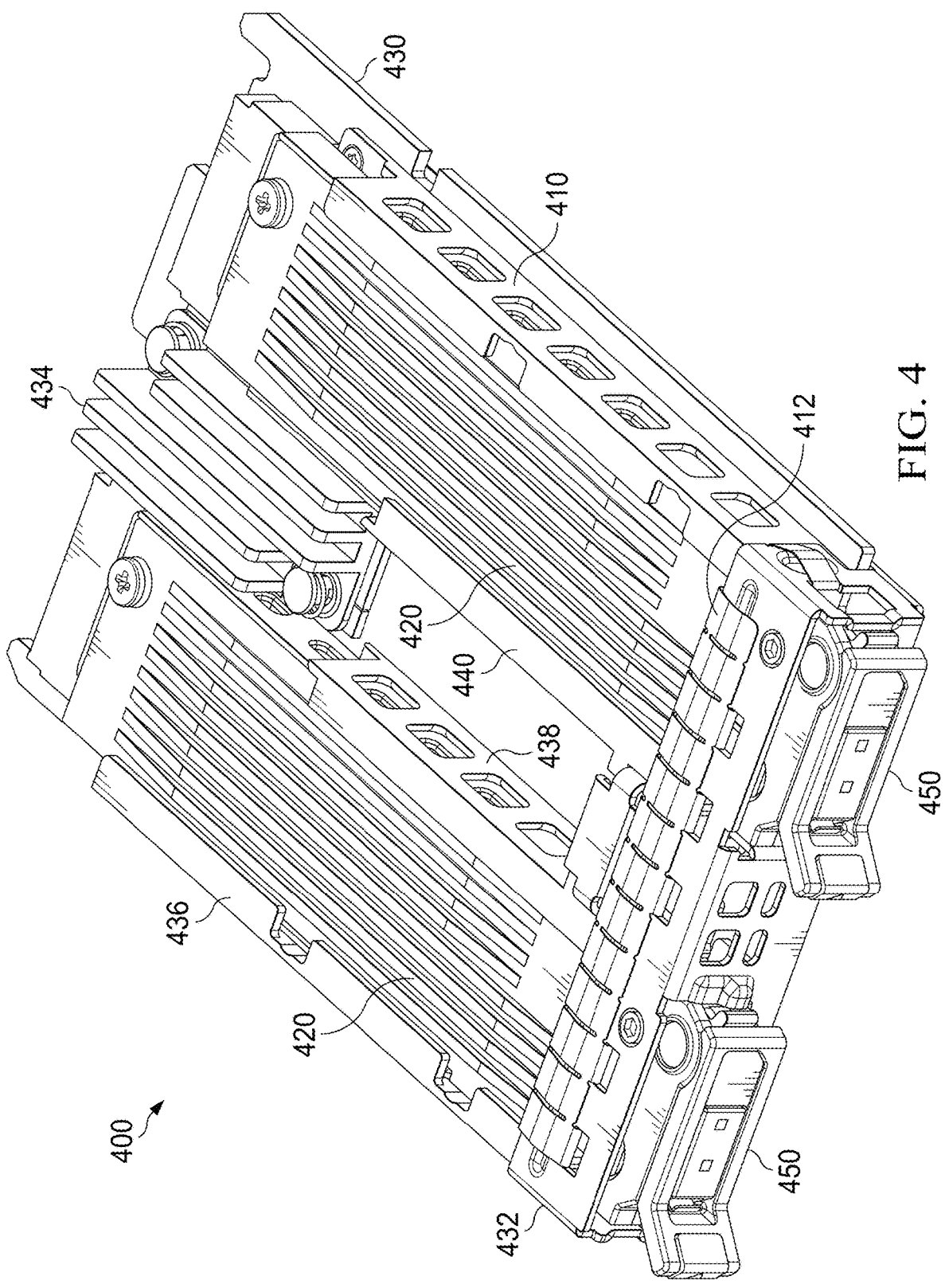
FIG. 4 shows a storage system with a plurality of latching systems.

FIG. 4 shows a storage system 400 with a plurality of latching systems 405. In certain embodiments, the storage system 400 corresponds to storage system 150. In certain embodiments, each latching system 405 includes a latching mechanism and a latch engagement portion.

In certain embodiments, the storage system 400 corre- sponds to storage system 150. In certain embodiments, the storage module housing 410 includes an electro-magnetic shield component 412. In certain embodiments the storage module housing 410 includes a bottom wall 430, a front housing portion 432, an outside right wall 434, an outside left wall 436, an inside right wall 438, an inside left wall 440, or a combination thereof. In certain embodiments, the electro-magnetic shield component 412 extends laterally across the front housing portion 432.

In certain embodiments, the housing portion 432 extends substantially perpendicularly (i.e., +/−20%) from the bottom wall 430. In certain embodiments, the front wall extends substantially perpendicularly (i.e., +/−20%) from the bottom wall 430. In certain embodiments, the outside right wall 434 extends substantially perpendicularly (i.e., +/−20%) from the bottom wall 430. In certain embodiments, the outside left wall 436 extends substantially perpendicularly (i.e., +/−20%) from the bottom wall 430. In certain embodiments, the right inside wall 438 extends substantially perpendicu- larly (i.e., +/−20%) from the bottom wall 430. In certain embodiments, the left inside wall 440 extends substantially perpendicularly (i.e., +/−20%) from the bottom wall 430. It will be appreciated that the orientations of the walls will be reversed when the storage system is installed at the rear of the information handling systems (e.g., the front housing portion 432 is effectively a rear housing portion).

In certain embodiments, the front housing portion 432 defines one or more apertures via which storage cartridge modules 420 may be installed in the storage module housing 410. In certain embodiments pairs of left and right walls (e.g., a left outside wall and a right inside wall) include channels via which respective storage cartridges may be inserted and mounted to the storage module housing 410. In certain embodiments, the left and right walls include channels via which respective storage cartridges may be inserted and mounted to the storage module housing 410. In certain embodiments, the outside right wall 434 and the inside left wall 440 define channels via which a storage cartridge module 420 may be installed in the storage module housing 410. In certain embodiments, the outside left wall 436 and the inside right wall 438 define channels via which a storage cartridge module 420 may be installed in the storage module housing 410.

In certain embodiments, when the storage cartridge module 420 is configured in a hot swap storage media access configuration, each storage cartridge module 420 includes a respective latch 450 which allows a user to unlatch the storage cartridge module and remove the storage cartridge module from the storage system.

Figure 5:
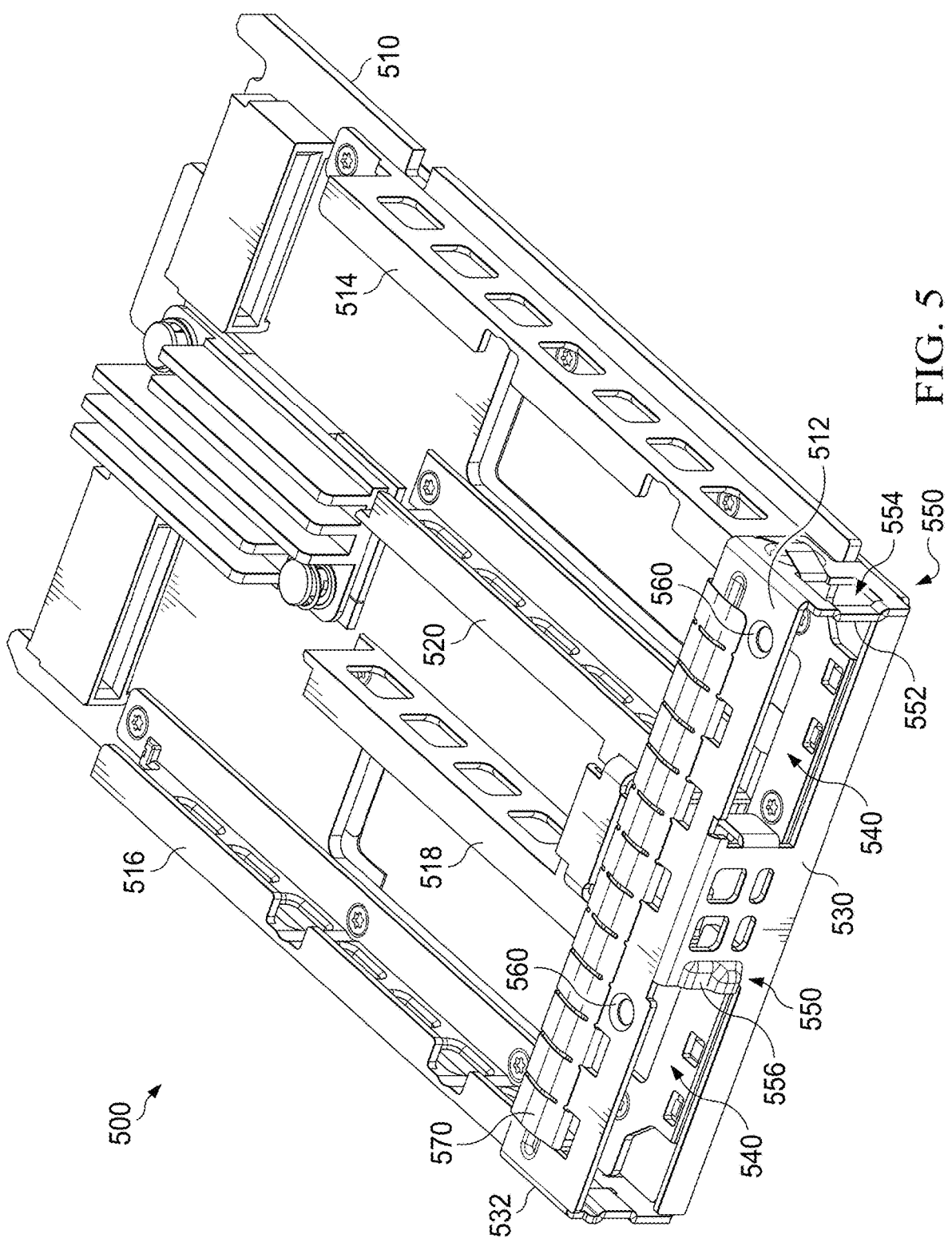
FIG. 5 shows a perspective view of a storage system housing of a storage system.

FIG. 5 shows a perspective view of a storage system housing 500 of a storage system. In certain embodiments, the storage system housing 500 corresponds to storage system housing 410. In certain embodiments, the storage system corresponds to storage system 150. In certain embodiments, the storage system housing 500 is designed to function with a boot optimized storage system.

In certain embodiments the storage module housing 500 includes a bottom wall 510, a front housing portion 512, an outside right wall 514, an outside left wall 516, an inside right wall 518, an inside left wall 520, or a combination thereof. In certain embodiments, the front housing portion 512 extends substantially perpendicularly (i.e., +/−20%) from the bottom wall 510. In certain embodiments, the front wall extends substantially perpendicularly (i.e., +/−20%) from the bottom wall 510. In certain embodiments, the outside right wall 514 extends substantially perpendicularly (i.e., +/−20%) from the bottom wall 510. In certain embodiments, the outside left wall 516 extends substantially perpendicularly (i.e., +/−20%) from the bottom wall 510. In certain embodiments, the right inside wall 518 extends substantially perpendicularly (i.e., +/−20%) from the bottom wall 510. In certain embodiments, the left inside wall 520 extends substantially perpendicularly (i.e., +/−20%) from the bottom wall 510. It will be appreciated that the orientations of the walls will be reversed when the storage system is installed at the rear of the information handling systems (e.g., the front housing portion 512 is effectively a rear housing portion).

In certain embodiments pairs of left and right walls (e.g., a left outside wall and a right inside wall) include channels via which respective storage cartridges may be inserted and mounted to the storage module housing 410. In certain embodiments, the left and right walls include channels via which respective storage cartridges may be inserted and mounted to the storage module housing 410. In certain embodiments, the outside right wall 514 and the inside left wall 520 define channels via which a storage cartridge module 420 may be installed in the storage module housing 410. In certain embodiments, the outside left wall 516 and the inside right wall 518 define channels via which a storage cartridge module 420 may be installed in the storage module housing 410.

In certain embodiments, the front housing portion 512 includes a housing portion front wall 530 and a housing portion top wall 532. In certain embodiments, the housing portion front wall 530 extends substantially perpendicularly (i.e., +/−20%) from the bottom wall 510. In certain embodiments, the housing portion top wall 532 extends substantially perpendicularly (i.e., +/−20%) from the housing portion top wall 530. In certain embodiments, the housing portion front wall 530 provides a customer facing surface.

In certain embodiments, the housing portion front wall 530 defines one or more apertures 540 via which storage cartridge modules may be installed in the storage module housing 410. In certain embodiments, each aperture 540 includes a respective latching portion 550. In certain embodiments, a latching portion 550 includes a latch tab 552 and a latch aperture 554 via which a latch mates. In certain embodiments, the latch tab 552 and the latch aperture 554 are located on an outside wall of the housing portion 512. In certain embodiments, a latching portion 550 includes a latch bump out 556 via which a latch mates. In certain embodiments, the latch bump out 556 is located on the front wall 530 of the housing portion 512. In certain embodiments, the housing portion top wall 532 defines one or more housing locking apertures 560. In certain embodiments, a fastener secures a storage cartridge module to the storage module housing 500 when the storage system is configured in a locking configuration. In certain embodiments, the latch tab 552 and the latch bump out 556 function as respective latch engagement portions. In certain embodiments, the latch tab 552 functions as a latch engagement portion having a corresponding latching configuration. In certain embodiments, the latch bump out 556 functions as a latch engagement portion having a corresponding latching configuration. In certain embodiments, the latching configuration of the latch tab 552 and the latching configuration of the latch bump out 556 are different latching configurations.

In certain embodiments, the storage module housing 500 includes an electro-magnetic shield component 570. In certain embodiments, the electro-magnetic shield component 570 corresponds to electro-magnetic shield component 412. In certain embodiments, the electro-magnetic shield component 570 extends across the front housing portion 512. In certain embodiments, electro-magnetic shield component 570 extends across the housing portion top wall 532.

Figure 6:
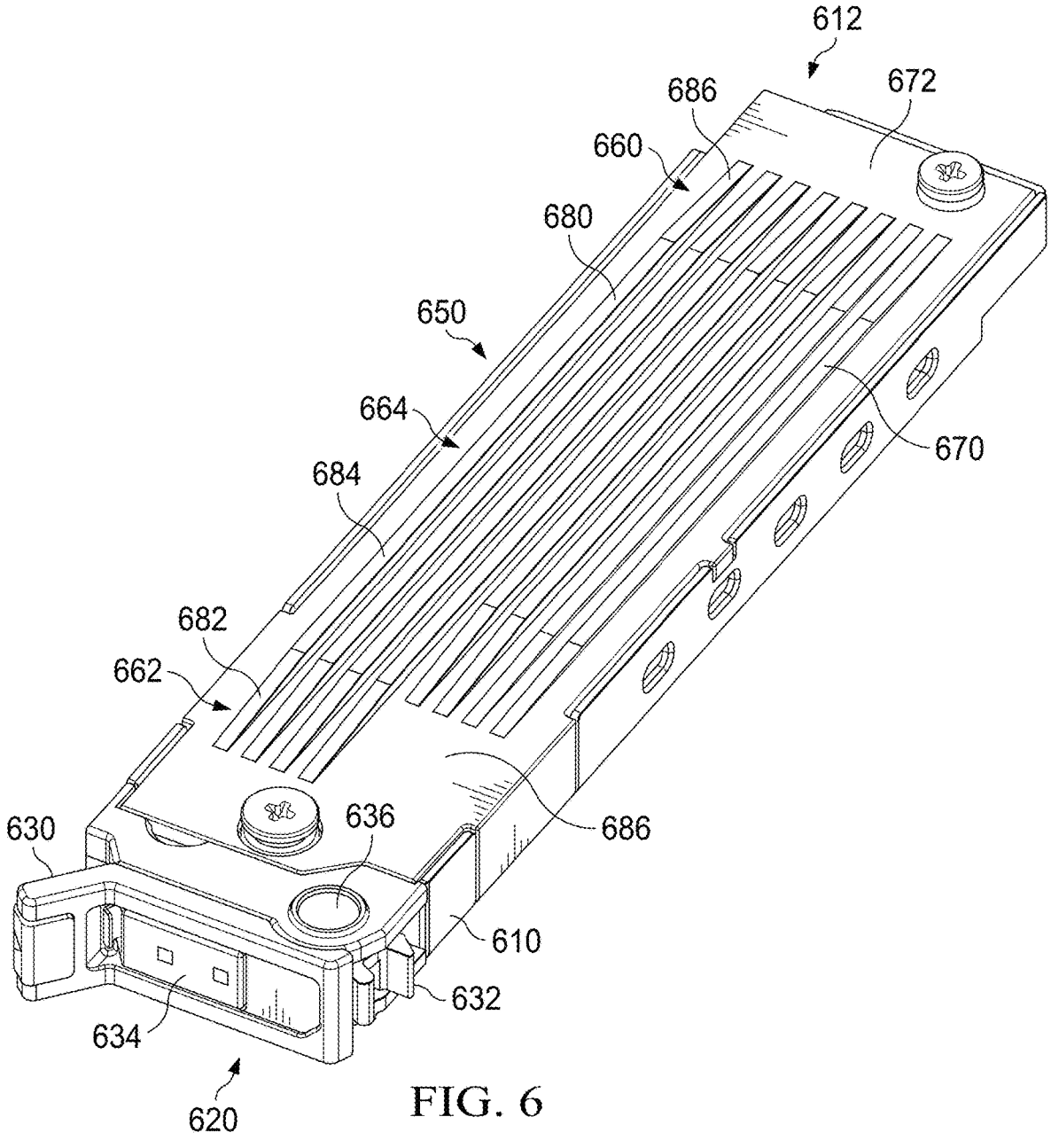
FIG. 6 shows a perspective view of a storage system component.

FIG. 6 shows a perspective view of a storage system component 600 (also referred to as a storage cartridge). In certain embodiments, the storage system component 600 corresponds to storage cartridge module 420. In certain embodiments, the storage system corresponds to storage system 150.

In certain embodiments the storage system component 600 includes a bottom component 610 and a top cover 612. In certain embodiments, the bottom component 610 and the top cover 612 are configured to receive a latch component 630. In certain embodiments, the bottom component 610 defines an attachment aperture, includes an attachment component, or a combination thereof. In certain embodiments, the attachment component includes a nut. In certain embodiments, the attachment aperture, the attachment component, or a combination thereof, are used to attach a latch component 630 to the storage system component 600. In certain embodiments, the attachment component mates with a faster to mount the top cover 612 to the bottom component 610.

In certain embodiments, a latch mechanism includes a latch hook portion 632. In certain embodiments, the latch 630 and the latch hook portion 632, or a combination thereof are included within a latch mechanism. In certain embodiments, the latch hook portion 632 is configured to interact with a latch engagement portion.

In certain embodiments, the top cover 612 includes an optimized electro-magnetic shield interface 650. In certain embodiments, the optimized electron magnetic shield interface 650 includes an insertion chamfer portion 660, a removal chamfer portion 662, a top wall portion 664, or a combination thereof. In certain embodiments, the insertion chamfer portion 660 has a corresponding insertion chamfer angle. In certain embodiments, the removal chamfer portion 662 has a corresponding removal chamfer angle. In certain embodiments, the corresponding insertion chamfer angle is based upon a trailing electro-magnetic shield spring angle. In certain embodiments, the corresponding removal chamfer angle is based upon a leading electro-magnetic shield spring angle.

In certain embodiments, the optimized electro-magnetic shield interface 650 includes a plurality of raised ribs 670. In certain embodiments, the plurality of raised ribs extends laterally across a depth of the top wall 672. In certain embodiments, each of the plurality of raised ribs 670 are raised relative to a top wall 672 of the top cover 612. In certain embodiments, the plurality of raised ribs extends laterally across a depth of the top wall 672 of the top cover 612. In certain embodiments, each of the plurality of raised ribs 670 includes a respective insertion chamfer 680, a respective removal chamfer 682, a respective top rib portion 684, or a combination thereof. In certain embodiments, some of the respective top rib portions 684 are shorter relative to other of the respective rib portions 684. In certain embodiments, providing some of the respective top rib portions 684 shorter relative to other of the respective rib portions 684 provides a portion 686 of the top wall 672 via which instruction markings may be applied to the top cover 612, while still enabling an optimized electro-magnetic shield interface.

Figure 7:
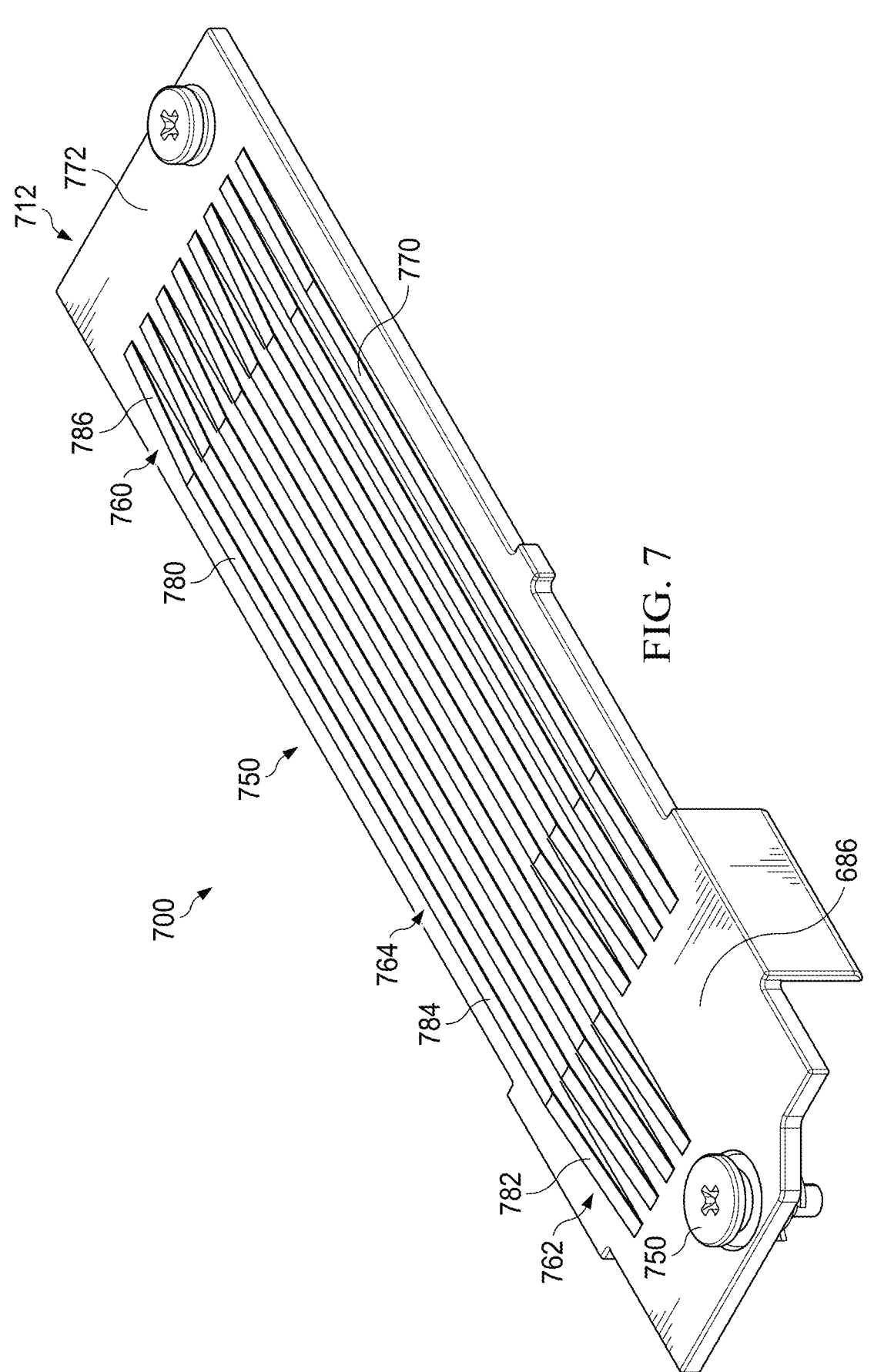
FIG. 7 shows a perspective view of a top panel of a storage system component.

FIG. 7 shows a perspective view of a top cover 700 of a storage system component. In certain embodiments, the top cover 700 corresponds to top panel 712. In certain embodiments, the storage system corresponds to storage system 150.

In certain embodiments, the top cover 700 includes an optimized electro-magnetic shield interface 750. In certain embodiments, the optimized electron magnetic shield interface 750 includes an insertion chamfer portion 760, a removal chamfer portion 762, a top wall portion 764, or a combination thereof. In certain embodiments, the insertion chamfer portion 760 has a corresponding insertion chamfer angle. In certain embodiments, the removal chamfer portion 762 has a corresponding removal chamfer angle. In certain embodiments, the corresponding insertion chamfer angle is based upon a trailing electro-magnetic shield spring angle. In certain embodiments, the corresponding removal chamfer angle is based upon a leading electro-magnetic shield spring angle.

In certain embodiments, the optimized electro-magnetic shield interface 750 includes a plurality of raised ribs 770. In certain embodiments, the plurality of raised ribs extends laterally across a depth of the top wall 772. In certain embodiments, each of the plurality of raised ribs 770 are raised relative to a top wall 772 of the top cover 700. In certain embodiments, the plurality of raised ribs extends laterally across a depth of the top wall 772 of the top cover 700. In certain embodiments, each of the plurality of raised ribs 770 includes a respective insertion chamfer 780, a respective removal chamfer 782, a respective top rib portion 784, or a combination thereof. In certain embodiments, some of the respective top rib portions 784 are shorter relative to other of the respective rib portions 784. In certain embodiments, providing some of the respective top rib portions 784 shorter relative to other of the respective rib portions 784 provides a portion 786 of the top wall 772 via which instruction markings may be applied to the top cover 700, while still enabling an optimized electro-magnetic shield interface.

Figure 8A:
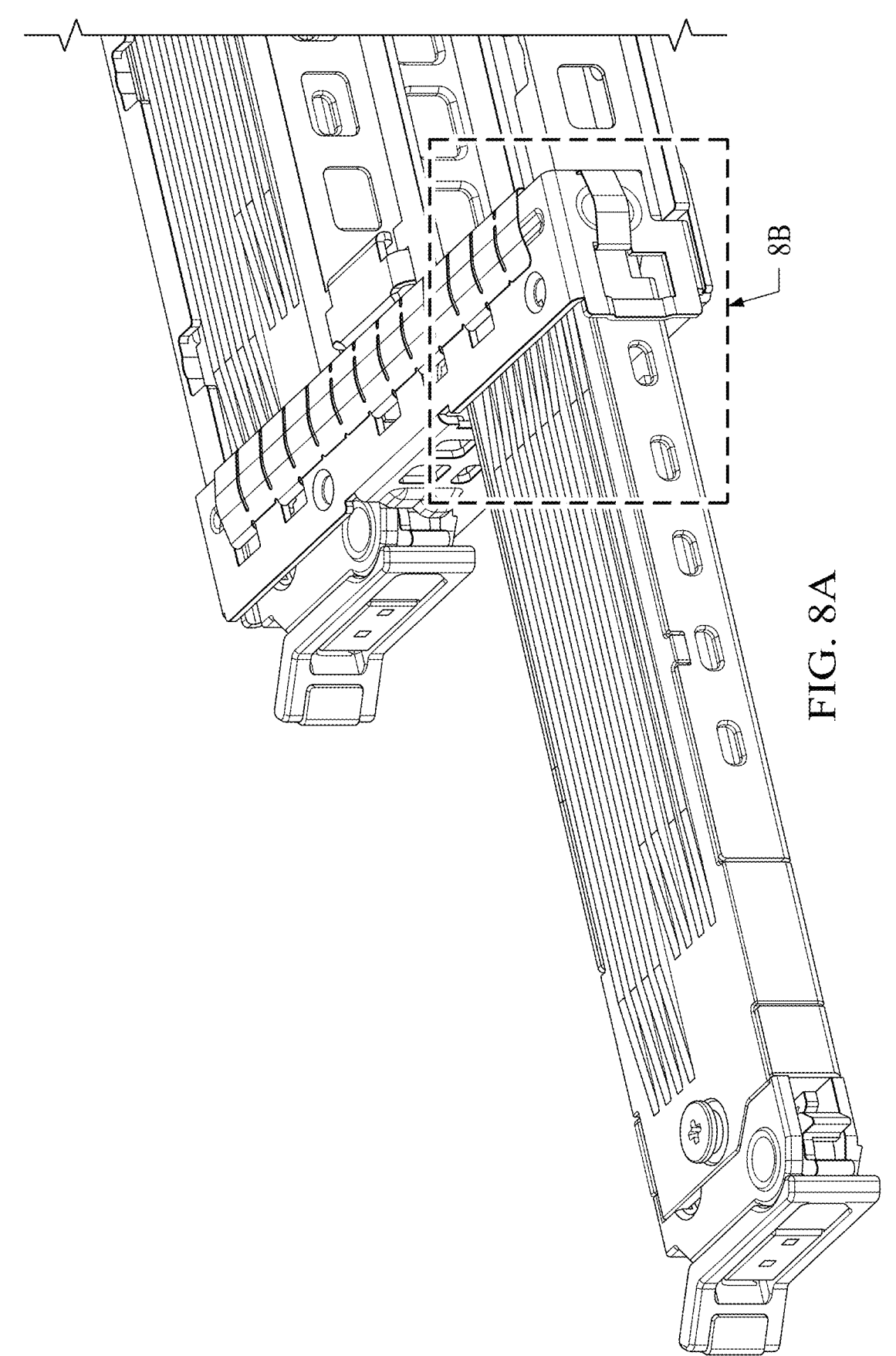
FIGS. 8A, 8B and 8C, generally referred to as FIG. 8, show views of a storage system component as the storage system component is installed in a storage system housing.
Figure 8B:
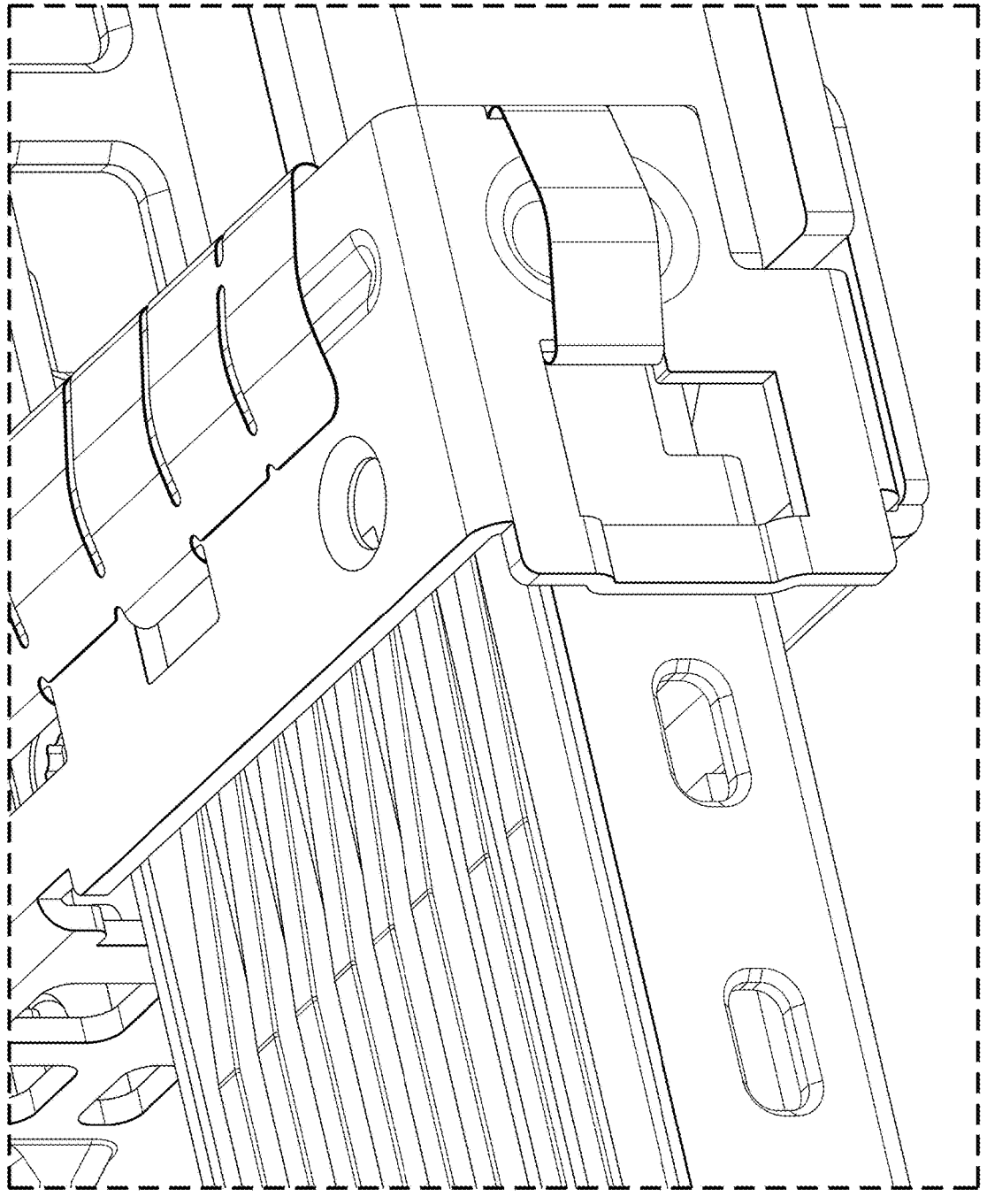
Figure 8C:
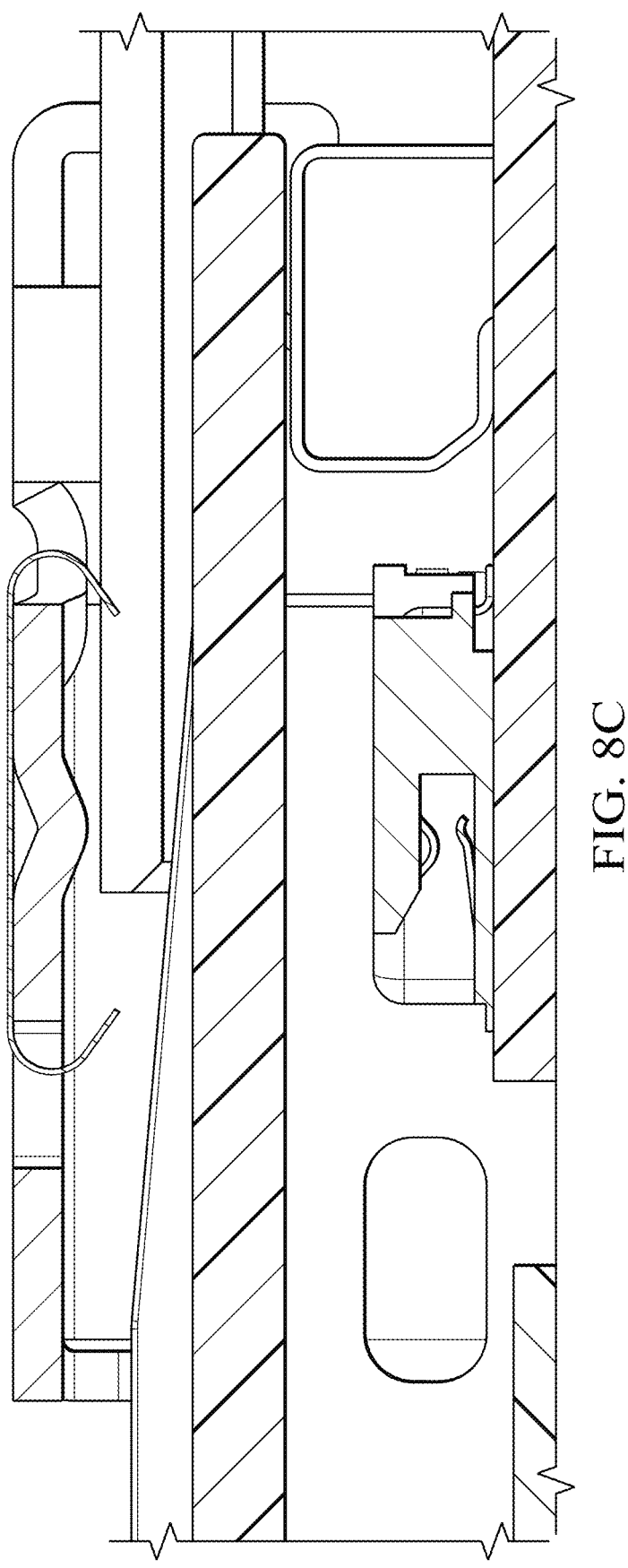

FIGS. 8A, 8B and 8C, generally referred to as FIG. 8, show views of a storage system component 800 as the storage system component is installed in a storage system housing 805. More specifically, FIG. 8A shows a perspective view of a storage system component 800 as the storage system component is installed in a storage system housing 805. FIG. 8B shows a detailed perspective view of a storage system component 800 as the storage system component is installed in a storage system housing 805. FIG. 8C shows a detailed cut away side view of a storage system component 800 as the storage system component is installed in a storage system housing 805.

In certain embodiments, the insertion chamfer angle, the removal chamfer angle, or a combination thereof provide a spring auto lock design which reduces a drop off issue associated with inserting the storage component 800 into the storage system housing 805. As used herein, a drop off broadly refers to an uneven edge between a storage component and an electro-magnetic shield component of a storage system housing where the uneven edge can affect the insertion or removal of the storage component to the storage system housing.

Figure 9A:
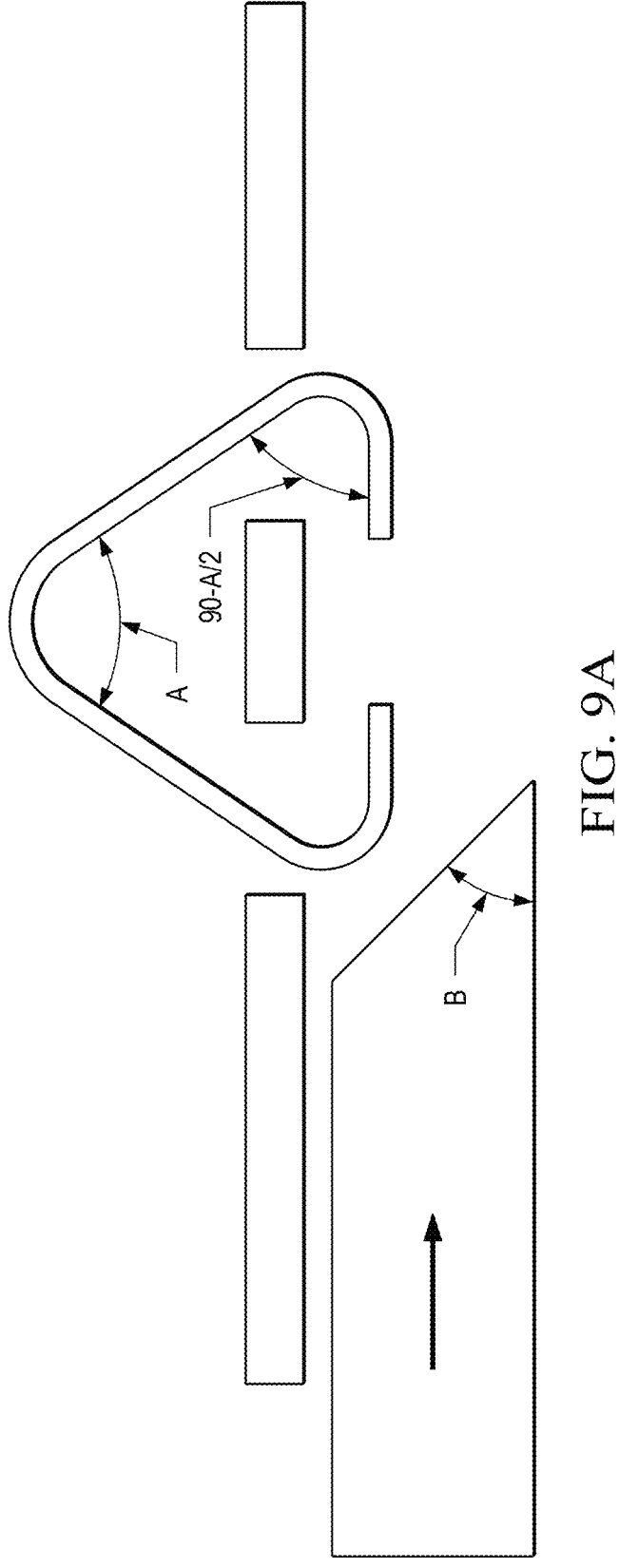
FIGS. 9A and 9B, generally referred to as FIG. 9, show diagrammatic side views of a storage system component as the storage system component is installed in a storage system housing.
Figure 9B:
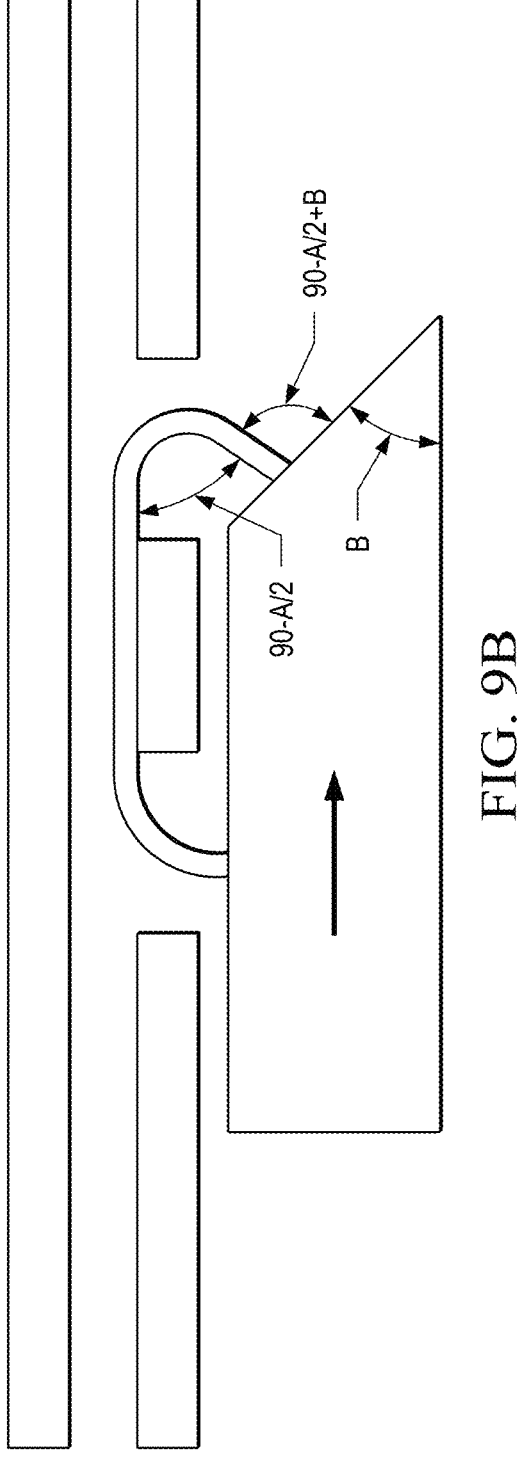

FIGS. 9A and 9B, generally referred to as FIG. 9, show diagrammatic side views of a storage system component as the storage system component is installed in a storage system housing. More specifically, FIG. 9A shows a diagrammatic side view of a storage system component 900 as the storage system component 900 is initially installed in a storage system housing. FIG. 9A also provides a diagrammatic representation of an electro-magnetic component 910 before the component is distended from being installed within an information handling system. FIG. 9B shows a diagrammatic side view of a storage system component 900 as the storage system component 900 is installed in a storage system housing and when the storage system component 900 interacts with a spring 920 of the electro-magnetic component 910. FIG. 9A also provides a diagrammatic representation of an electro-magnetic component after the component is distended from being installed within an information handling system.

In certain embodiments, the storage system component 900 has a corresponding insertion chamfer portion 920. In certain embodiments, the chamfer insertion portion 920 has a corresponding insertion chamfer angle ("B"). In certain embodiments, the electro-magnetic component has a corresponding top angle ("A"). In certain embodiments, the electro-magnetic component has a corresponding trailing electro-magnetic shield spring angle which is related to the top angle (90−A/2).

In certain embodiments, the corresponding insertion chamfer angle B is based upon the trailing electro-magnetic shield spring angle and may be defined such that (90−A/2+

B<90 degree). When the insertion chamfer angle B is so defined, the insertion chamfer portion performs as an auto locked mechanism.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A top cover for use with a storage system for an information handling system, comprising: a top wall, the top wall comprising an electro-magnetic shield interface facilitating insertion and removal of a storage component to a storage system housing having an associated electro-magnetic shield component.

2. The top cover of claim 1, wherein:
the electro-magnetic shield interface comprises an insertion chamfer portion, insertion chamfer portion having a corresponding insertion chamfer angle.

3. The top cover of claim 2, wherein:
the corresponding insertion chamfer angle is defined as 90−A/2+B<90 degree, where A represent a top angle of the electro-magnetic shield component and B represents the insertion chamfer angle.

4. The top cover of claim 2, wherein:
the electro-magnetic shield interface comprises a removal chamfer portion, removal chamfer portion having a corresponding removal chamfer angle.

5. The top cover of claim 1, wherein:
the electro-magnetic shield interface comprises a plurality of raised ribs, the plurality of raised ribs extending laterally across a depth of the top wall.

6. The top cover of claim 5, wherein:
each of the plurality of raised ribs comprises at least one of an insertion chamfer, a removal chamfer and a top rib portion.

7. A storage system comprising: a storage system cartridge module, the storage system cartridge module comprising a top cover, the top cover comprising; a top wall, the top wall comprising an electro-magnetic shield interface facilitating insertion and removal of a storage component to a storage system housing having an associated electro-magnetic shield component.

8. The storage system of claim 7, wherein:
the electro-magnetic shield interface comprises an insertion chamfer portion, insertion chamfer portion having a corresponding insertion chamfer angle.

9. The storage system of claim 8, wherein:
the corresponding insertion chamfer angle is defined as 90−A/2+B<90 degree, where A represent a top angle of the electro-magnetic shield component and B represents the insertion chamfer angle.

10. The storage system of claim 8, wherein:
the electro-magnetic shield interface comprises a removal chamfer portion, removal chamfer portion having a corresponding removal chamfer angle.

11. The storage system of claim 7, wherein:
the electro-magnetic shield interface comprises a plurality of raised ribs, the plurality of raised ribs extending laterally across a depth of the top wall.

12. The storage system of claim 11, wherein:
each of the plurality of raised ribs comprises at least one of an insertion chamfer, a removal chamfer and a top rib portion.

13. A system comprising: a chassis; a processor contained within the chassis; a data bus coupled to the processor; and, a storage system comprising a storage system cartridge module, the storage system cartridge module comprising a top cover, the top cover comprising; a top wall, the top wall comprising an electro-magnetic shield interface facilitating insertion and removal of a storage component to a storage system housing having an associated electro-magnetic shield component.

14. The system of claim 13, wherein:
the electro-magnetic shield interface comprises an insertion chamfer portion, insertion chamfer portion having a corresponding insertion chamfer angle.

15. The system of claim 14, wherein:
the corresponding insertion chamfer angle is defined as 90−A/2+B<90 degree, where A represent a top angle of the electro-magnetic shield component and B represents the insertion chamfer angle.

16. The system of claim 14, wherein:
the electro-magnetic shield interface comprises a removal chamfer portion, removal chamfer portion having a corresponding removal chamfer angle.

17. The system of claim 13, wherein:
the electro-magnetic shield interface comprises a plurality of raised ribs, the plurality of raised ribs extending laterally across a depth of the top wall.

18. The system of claim 17, wherein:
each of the plurality of raised ribs comprises at least one of an insertion chamfer, a removal chamfer and a top rib portion.

* * * * *